(12) United States Patent
Ichihara et al.

(10) Patent No.: US 9,305,645 B2
(45) Date of Patent: Apr. 5, 2016

(54) VARIABLE RESISTIVE ELEMENT, STORAGE DEVICE AND DRIVING METHOD THEREOF

(71) Applicant: Kabushiki Kaisha Toshiba, Minato-ku (JP)

(72) Inventors: Reika Ichihara, Kanagawa (JP);
Daisuke Matsushita, Kanagawa (JP);
Takayuki Ishikawa, Kanagawa (JP);
Hiroki Tanaka, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 135 days.

(21) Appl. No.: 14/044,076

(22) Filed: Oct. 2, 2013

(65) Prior Publication Data
US 2014/0133210 A1    May 15, 2014

(30) Foreign Application Priority Data

Nov. 15, 2012 (JP) .................................. 2012-251424

(51) Int. Cl.
*G11C 13/00* (2006.01)
*H01L 45/00* (2006.01)

(52) U.S. Cl.
CPC .......... *G11C 13/0069* (2013.01); *G11C 13/003* (2013.01); *G11C 13/004* (2013.01); *G11C 13/0011* (2013.01); *H01L 45/085* (2013.01); *H01L 45/1233* (2013.01); *H01L 45/1266* (2013.01); *H01L 45/145* (2013.01); *H01L 45/146* (2013.01); *G11C 2213/76* (2013.01)

(58) Field of Classification Search
CPC ........... G11C 13/0002; G11C 13/0069; G11C 13/004; H01L 45/04

USPC ...................................... 365/63, 148; 257/1, 4
See application file for complete search history.

(56) References Cited

U.S. PATENT DOCUMENTS

| | | | |
|---|---|---|---|
| 8,692,223 B2 * | 4/2014 | Moon et al. ........................ 257/4 |
| 8,693,233 B2 * | 4/2014 | Scheuerlein et al. ......... 365/148 |
| 9,006,698 B2 * | 4/2015 | Wei et al. ........................... 257/4 |
| 2012/0091420 A1 * | 4/2012 | Kusai et al. ........................ 257/4 |
| 2012/0211719 A1 * | 8/2012 | Haimoto et al. ................... 257/4 |
| 2013/0234097 A1 | 9/2013 | Fujii et al. |

OTHER PUBLICATIONS

F.M. Lee et al. "A Novel Cross Point One-Resistor (0T1R) Conductive Bridge Random Access Memory (CBRAM) with Ultra Low Set/Reset Operation Current", 2012 Symposium on VLSI Technology Digest of Technical Papers, 2 pages.

* cited by examiner

*Primary Examiner* — Huan Hoang
*Assistant Examiner* — Tri Hoang
(74) *Attorney, Agent, or Firm* — Oblon, McClelland, Maier & Neustadt, L.L.P.

(57) ABSTRACT

An element according to an embodiment can transit between at least two states including a low-resistance state and a high-resistance state. The element comprises a first electrode, a second electrode, a first layer and a second layer. The first electrode includes metal elements. The first layer is located between the first electrode and the second electrode while contacting with the first electrode. The second layer is located between the first layer and the second electrode. At the low-resistance state, a density of the metal elements in the first layer is higher than that of the metal elements in the second layer. The density of the metal elements in the first layer at the low-resistance state is higher than that of the metal elements in the first layer at the high-resistance state. A relative permittivity of the second layer is higher than a relative permittivity of the first layer.

8 Claims, 9 Drawing Sheets

VARIABLE RESISTIVE ELEMENT, STORAGE DEVICE AND DRIVING METHOD THEREOF

CROSS-REFERENCE TO RELATED APPLICATION(S)

This application is based upon and claims the benefit of priority from the Japanese Patent Application No. 2012-251424, filed on Nov. 15, 2012; the entire contents of which are incorporated herein by reference.

FIELD

An embodiment described herein relates generally to a variable resistive element, a storage device and a driving method thereof.

BACKGROUND

In recent years, a variable resistive element has gained attention as a succession candidate for a floating-gate type semiconductor memory. A variable resistive memory can store data in non-volatile by changing a resistance of a variable resistive layer based on impression of a voltage pulse. The variable resistive memory has a simple structure such as a two-terminal structure. Therefore, by applying the variable resistive memory to a cross-point type memory cell array, it is easily possible to construct a large-capacity memory as compared to a case where the floating-gate type semiconductor memory is applied to a cross-point type memory cell array.

In the case of the cross-point type, in order to suppress possible influence of a bypass current, it is essential that a reverse current of the memory cell is sufficiently smaller than a forward current. Therefore, normally, the memory cell is structured as serial connections of variable resistive elements and diodes. However, in such case, due to a difference between the variable resistive element and the diode, and to a thickness of the diode in a current pass direction, manufacturing processes tend to become complicated requiring high-cost while an operating voltage increases.

On the other hand, technologies for realizing a variable resistive element having a rectifying property therein have been developing by applying a stack structure of a rectifier function layer and a retention layer to the memory cell, a retention characteristic of the rectifier functional layer at an on-state (low resistance state) being poor while a retention characteristic of the retention layer at a on-state being good. However, even in such case, the operating voltage still increases as compared to the memory cell constructed only from the retention layer.

DETAILED DESCRIPTION

An exemplary embodiment of a variable resistive element, a storage device having the variable resistive element and a driving method thereof will be explained below in detail with reference to the accompanying drawings.

Figure 1:
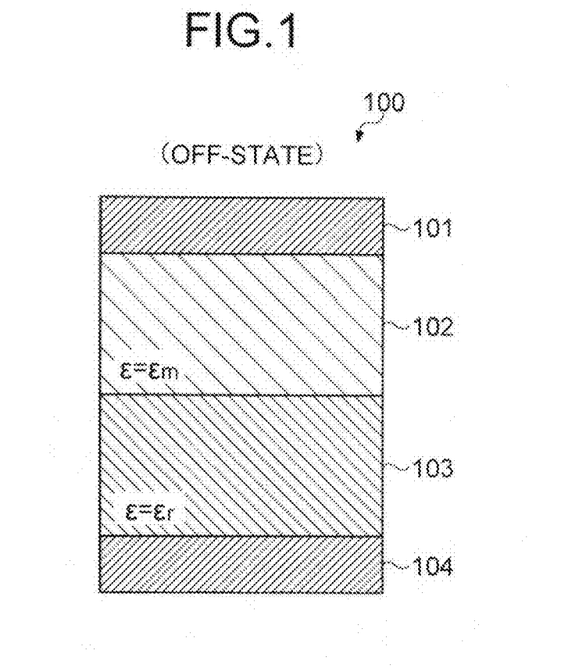
FIG. 1 is a cross-sectional view showing an example of a variable resistive element at an off-state according to an embodiment.
Figure 2:
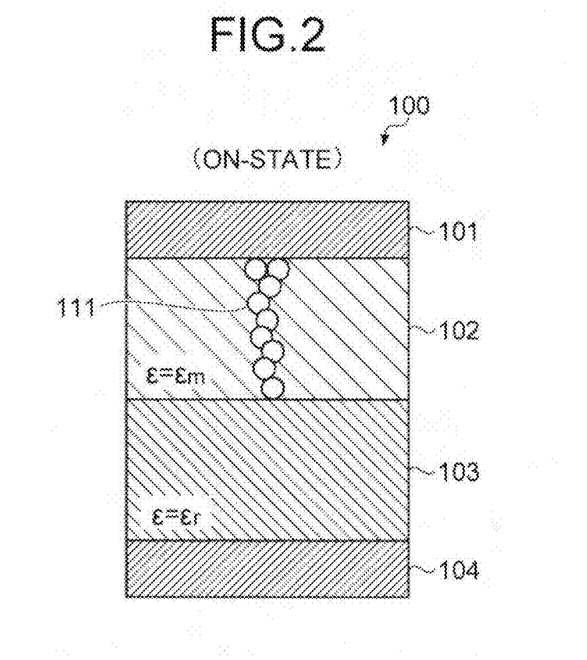
FIG. 2 is a cross-sectional view showing an example of the variable resistive element at a on-state according to the embodiment.

An example of a cross-section structure of a variable resistive element according to an embodiment will be shown in FIGS. 1 and 2. FIG. 1 shows an example of the variable resistive element at an off-state, and FIG. 2 shows an example of the variable resistive element at an on-state.

As shown in FIGS. 1 and 2, the variable resistive element 100 has a structure in that two variable resistive layers (a retention layer 102 and a rectifier function layer 103) are stacked between a first electrode 101 including first metal elements and a second electrode 104. The retention layer 102 located at a near side of the first electrode 101 functions as a retention layer for retaining data. The rectifier function layer 103 located at a near side of the second electrode 104 functions as a layer for limiting a current flowing through the variable resistive element 100. A relative permittivity $\epsilon r$ of the rectifier function layer 103 is higher than a relative permittivity $\epsilon m$ of the retention layer 102.

With respect to the variable resistive element 100, by applying a voltage stress (hereinafter referred to as set voltage) being necessary for data writing (set) between the first electrode 101 and the second electrode 104, the first metal elements included in the first electrode 101 are diffused toward the second electrode 104, and as a result, a conductive filament 111 made of the first metal elements is formed in the retention layer 102. Here, "set" means a transition from an off-state to an on-state. In the following, "data writing" will be referred to as "set".

Unless impressing a stress voltage (hereinafter referred to as reset voltage) being necessary for data erase (reset) between the first electrode 101 and the second electrode 104, the conductive filament 111 will be maintained even without a voltage impressed between the first electrode 101 and the second electrode 104. Therefore, a density of the first metal elements (atomic %) in the retention layer 102 at the on-state (shown in FIG. 2) is greater than a density of the first metal elements (atomic %) in the retention layer 102 at the off-state (shown in FIG. 1). Here, "reset" means a transition from the on-state to the off-state. In the following, "data erase" will be referred to as "reset".

Although the first metal elements will diffuse into the rectifier function layer 103 by having the set voltage impressed to the variable resistive element 100, because a conductive filament made of the first metal elements is not formed stably in the rectifier function layer 103, the density of the first metal elements (atomic %) in the retention layer 102 at the on-state (shown in FIG. 2) is greater than a density of the first metal elements (atomic %) in the rectifier function layer 103 at the on-state (shown in FIG. 2).

Figure 3:
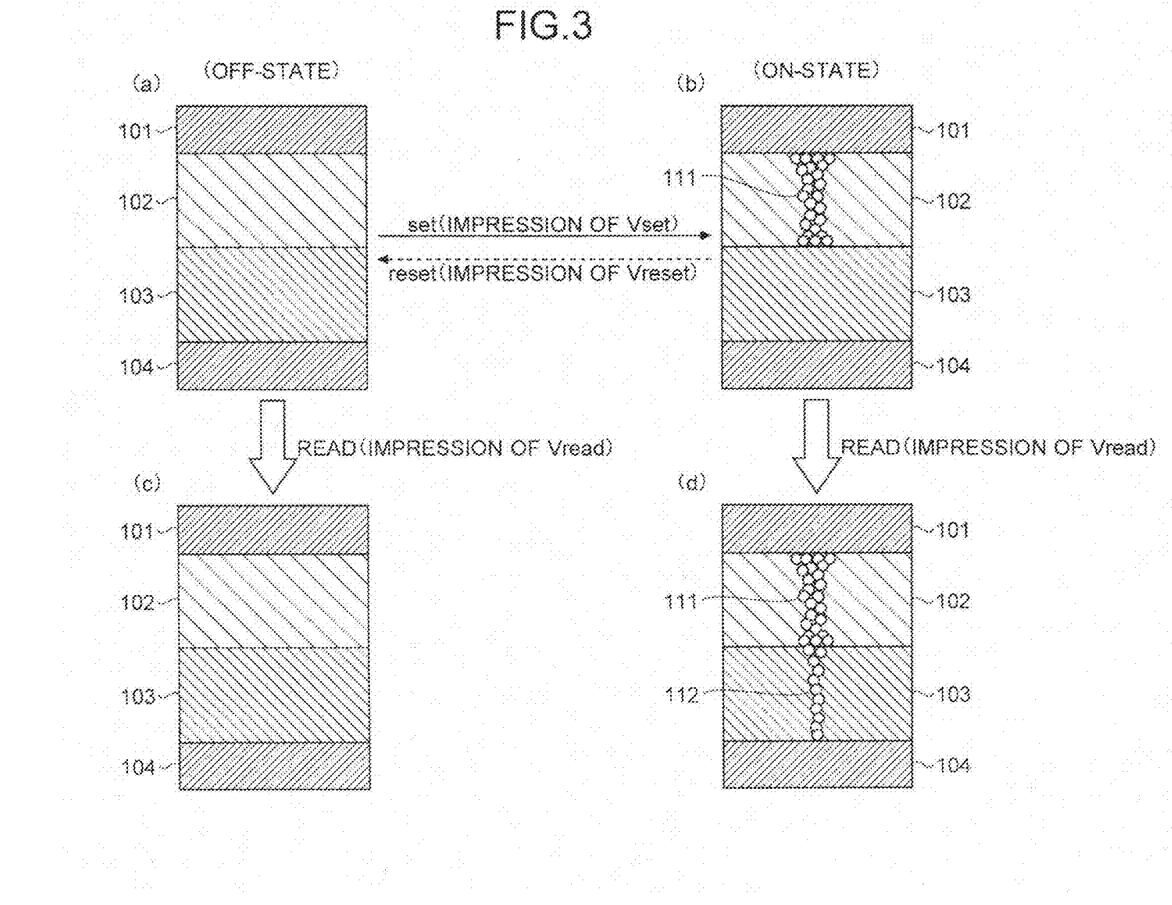
FIG. 3 is an illustration for explaining operations of the variable resistive element according to the embodiment.

FIG. 3 is an illustration for explaining operations of the variable resistive element constructed as a stack structure of the retention layer and the rectifier function layer. FIG. 3(*a*) shows the variable resistive element 100 at the off-state, and FIG. 3(*b*) shows the variable resistive element 100 at the on-state. FIG. 3(*c*) shows a case where a voltage for data readout (hereinafter referred to as readout voltage) is impressed to the off-state variable resistive element 100, and FIG. 3(*d*) shows a case where the readout voltage is impressed to the on-state variable resistive element 100.

Whether the state of the variable resistive element 100 is off-state or on-state can be determined by measuring a current flowing through the variable resistive element 100 at a time when the readout voltage Vread is impressed to the variable resistive element 100.

As shown in FIGS. 3(*a*) and 3(*b*), when the set voltage Vset is impressed to the off-state variable resistive element 100, the conductive filament 111 is formed in the retention layer 102. The conductive filament 111 is made of the first metal elements included in the first electrode 101. Here, in terms of formability of the conductive filament 111, it is preferable that the first metal element is one of silver (Ag), copper (Cu), nickel (Ni), cobalt (Co), aluminum (Al) and titanium (Ti). However, it is not limited to such metal elements.

As shown in FIGS. 3(*b*) and 3(*a*), when the reset voltage Vreset is impressed to the on-state variable resistive element 100, the conductive filament 111 in the retention layer 102 is decomposed and disappears. As a result, the variable resistive element 100 transits from the on-state to the off-state.

As shown in FIGS. 3(*b*) and 3(*d*), when the readout voltage Vread is impressed to the on-state variable resistive element 100, a conductive filament 112 grows within the rectifier function layer 103 in such a way as to electrically connect between the conductive filament 111 formed in the retention layer 102 and the second electrode 104. On the other hand, as shown in FIGS. 3(*a*) and 3(*c*), even if the readout voltage Vread is impressed to the off-state variable resistive element 100, no state transition will occur. Thereby, it is possible to obtain a sufficiently large current difference between the on-state and the off-state at a time of impression of the readout voltage Vread.

The conductive filament 112 formed in the rectifier function layer 103 at a data readout during the on-state does not have non-volatility. That is, immediately after the readout voltage Vread is terminated, the conductive filament 112 in the rectifier function layer 103 is decomposed and disappear. As a result, the variable resistive element 100 turns back to the on-state shown in FIG. 3(*b*). Therefore, except for the variable resistive element 100 subjected to readout, regardless of whether the state of the element is on-state or off-state, a state of a current flowing through the element being suppressed is maintained. Naturally, a reverse current flowing through the element is also suppressed. In this way, the variable resistive element 100 according to the embodiment has a rectification function.

Figure 4:
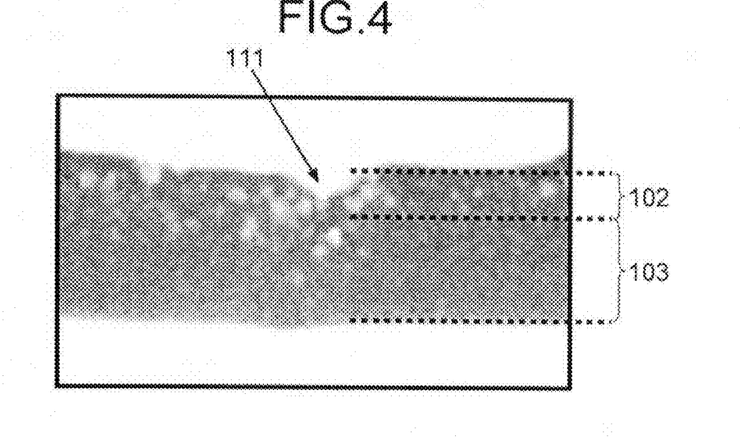
FIG. 4 is a bright-field image of a cross-section of the variable resistive element at an on-state after data setting according to the embodiment.
Figure 5:
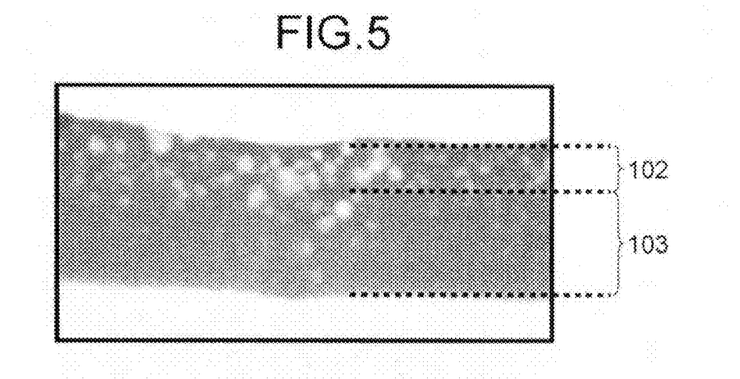
FIG. 5 is a bright-field image of a cross-section of the variable resistive element at an off-state after data reset according to the embodiment.
Figure 6:
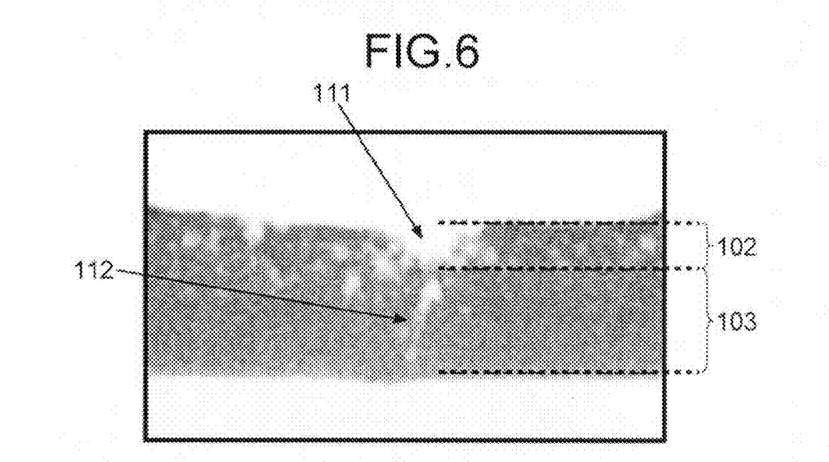
FIG. 6 is a bright-field image of a cross-section of the variable resistive element in a case where a readout voltage is impressed to an on-cell according to the embodiment.

FIGS. 4 to 6 are bright-field images taken by In situ Scanning TEM (transmission electron microscope) observation for observing a physical state inside an operating memory cell. This is for conducting a cross-section TEM observation while conducting an electrical characteristic evaluation. FIG. 4 is a bright-field image taken by observing a cross-section of the variable resistive element 100 (hereinafter to be also referred to as on-cell) at the on-state after data setting, FIG. 5 is a bright-field image taken by observing a cross-section of the variable resistive element 100 (hereinafter to be also referred to as off-cell) at the off-state after data reset, and FIG. 6 is a bright-field image taken by observing a cross-section of the variable resistive element 100 in a case where a readout voltage is impressed to the on-cell. In the In situ Scanning TEM observation, Ag is used as the first metal element.

In FIGS. 4 to 6, bright parts indicate Ag. For instance, as evidenced by comparing FIG. 4 and FIG. 5, in the on-cell shown in FIG. 4, the conductive filament 111 made by Ag is formed in the retention layer 102, and in the off-cell shown in FIG. 5, the conductive filament 111 made by Ag in the retention layer 102 is disappeared. Furthermore, as shown in FIG. 6, when the readout voltage is impressed to the on-cell, the conductive filament 112 is formed in the rectifier function layer 103 as the conductive filament 111 in the retention layer 102 extends.

Figure 7:
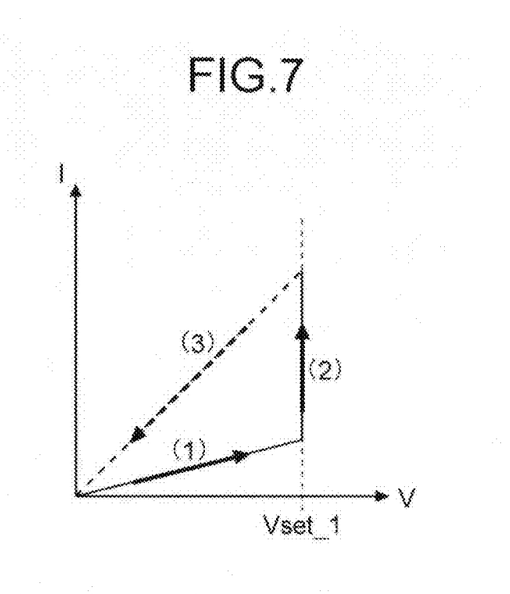
FIG. 7 is an operation diagram for explaining an operation of the variable resistive element at an off-state according to the embodiment.
Figure 8:
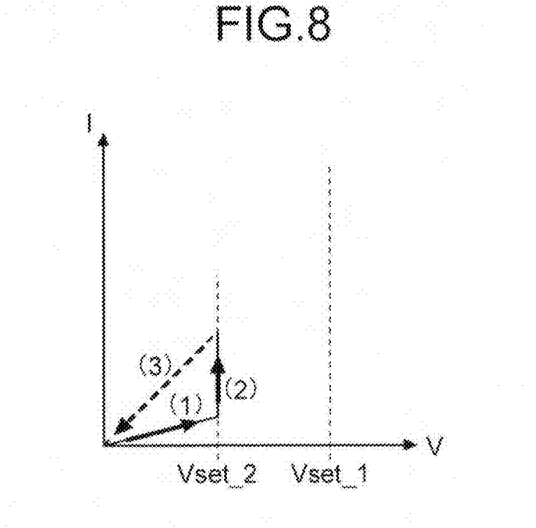
FIG. 8 is an operation diagram for explaining an operation of the variable resistive element at an off-state according to the embodiment.

By analyzing the bright-field images taken by In situ Scanning TEM observation, it is possible to understand a magnitude relation of densities of the first metal elements among the layers. For example, by comparing a proportion of an area of the bright parts with respect to a cross-section area of each layer, it is possible to understand a magnitude relation of Ag densities among the layers. As for another method, a method using EDX (energy dispersive X-ray spectroscopy) may be effective. In this method, by conducting an EDX mapping to each layer, an integrated value of peak areas belonging to the first metal element is calculated. Therefore, by comparing the calculated integrated value of each layer, it is possible to understand a magnitude relation of the first metal included in each layer. When a size of each layer is different (for instance, a thickness of the rectifier function layer 103 differs from a thickness of the retention layer 102), by standardizing the peak area in each layer based on a size of each layer, it is possible to understand the magnitude relation of the densities of the first metal element. Next, electrical characteristics being particular to the variable resistive element 100 in the embodiment will be described in detail with the accompanying drawings. FIG. 7 shows electrical characteristics of the off-state variable resistive element 100, and FIG. 8 shows electrical characteristic of the on-state variable resistive element 100. In FIGS. 7 and 8, a label (1) shows an I-V characteristic in a case where an impressed voltage is rose from 0 V until the conductive filaments 111 and 112 are formed in the retention layer 102 and the rectifier function layer 103, a label (2) shows an I-V characteristic at a time the conductive filaments 111 and 112 are formed in the retention layer 102 and the rectifier function layer 103 as a result of the rising of the impressed voltage as shown by (1), and a label (3) shows an I-V characteristic in a case where the impressed voltage falls down to 0 V after the conductive filaments 111 and 112 are formed.

As shown in FIGS. 7 and 8, when a round-trip sweeping of a voltage from 0 V to a predetermined voltage is repeated twice with respect to the off-state variable resistive element 100, a voltage for transiting a state of the variable resistive element 100 to a low-resistance state at a first sweeping (see FIG. 7), i.e. a set voltage Vset_1 for the off-state variable resistive element 100, is greater than a voltage for transiting the state of the variable resistive element 100 to the low-resistance state at a second sweeping (see FIG. 8), i.e. a set voltage Vset_2 (corresponding to a readout voltage) for the on-state variable resistive element 100. Here, a voltage for transiting to a low resistance state indicates a minimum voltage with which a current value Igo at an outward in the voltage sweeping and a current value Iback at a backward in the voltage sweeping satisfy the following formula (1).

$$(Iback - Igo)/Iback < 0.1 \quad (1)$$

Figure 9:
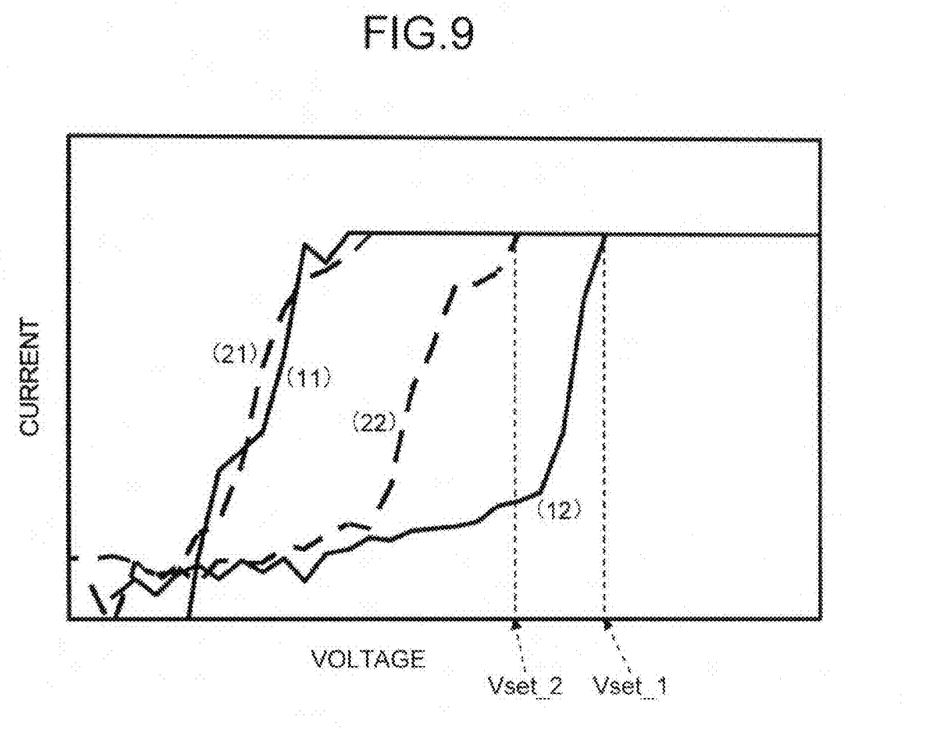
FIG. 9 is a graph showing an I-V characteristic obtained in a case where a round-trip sweeping of voltage is repeated twice with respect to the variable resistive element according to the embodiment.

FIG. 9 is a graph showing an I-V characteristic actually obtained in a case where a round-trip sweeping of voltage is repeated twice with respect to the off-state variable resistive element 100 constructed from the stack structure of the retention layer and the rectifier function layer as shown in FIGS. 7 and 8. As evidenced from FIG. 9, the set voltage Vset_1 at the first sweeping is greater than the set voltage Vset_2 at the second sweeping.

Here, in order to make it possible to suppress the current flowing through the non-selected cells effectively at a time of set operation for a memory cell array (hereinafter to be also referred to as cross-point array) in which the variable resistive elements 100 are arranged at cross-points, it is preferable that a relationship between the set voltages Vset_1 and Vset_2 satisfies the following formula (2).

$$Vset\_1 \le 2 \times Vset\_2 \quad (2)$$

Furthermore, considering a difference of a voltage difference between the first electrode 101 and the second electrode 104 occurred due to IR drop of wirings, which depends on cell positions in the cross-point array, it is preferable that the set voltages Vset_1 and Vset_2 satisfy the following formula (3).

$$Vset\_1 - Vset\_2 \ge 0.5 \, [V] \quad (3)$$

The electrical characteristics of a single cell in the cross-point array can be identified using a nano-prober. The nano-prober has a probe of which tip diameter is submicron. By having a desired electrode or wiring contact the tip of the nano-prober, it is possible to measure an I-V characteristic of a single cell. At that time, if it is not certain whether a target cell is at an on-state or an off-state, a reset stress can be applied to the target cell or whole of the memory cell array before measuring the I-V characteristic.

Meanwhile, as described above, "set" means a formation of the conductive filament 111 in the retention layer 102. Therefore, the set voltage Vset corresponds to a voltage applied to the hole variable resistive elements 100 required for impressing a voltage to the retention layer 102 that is enough for the retention layer 102 itself to be set. Naturally, the voltage impressed to the variable resistive element 100 is divided between the retention layer 102 and the rectifier function layer 103. Therefore, the rectifier function layer 103 makes the set voltage Vset applied to the whole variable resistive element 100 increase.

Figure 10:
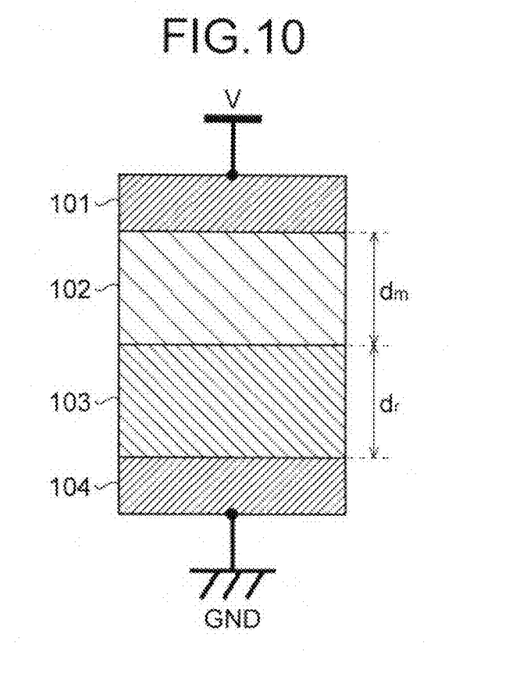
FIG. 10 is a diagram showing an example of a cross-section of the variable resistive element at an off-state according to the embodiment.
Figure 11:
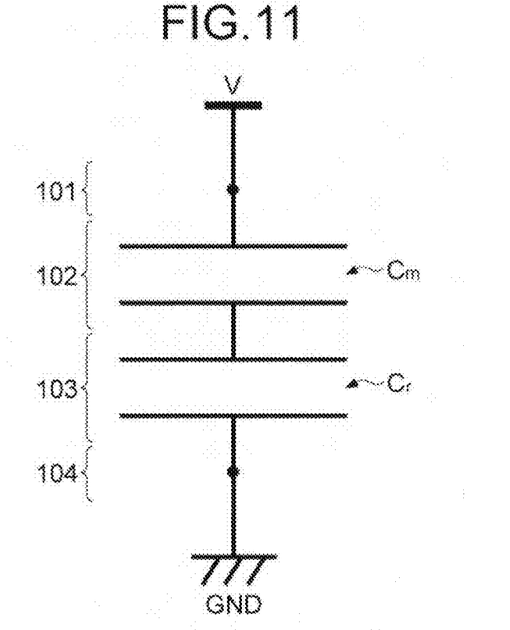
FIG. 11 is a circuit diagram showing an equivalent circuit of the variable resistive element in a case where a voltage is impressed to the off-state variable resistive element shown in FIG. 10.

FIG. 10 shows an example of a cross-section of the off-state variable resistive element 100, and FIG. 11 shows an equivalent circuit of the variable resistive element 100 in a case where a voltage is impressed to the off-state variable resistive element 100 shown in FIG. 10. In FIG. 10, because the retention layer 102 and the rectifier function layer 103 are insulators, as shown in FIG. 11, the equivalent circuit at the off-state is equal to a circuit in which a capacity Cm (capacity of the retention layer 102) and a capacity Cr (capacity of the rectifier function layer 103) are connected in series. The capacities Cm and Cr are represented by following formulas (4) and (b), respectively.

$$C_m = \frac{\varepsilon_m S}{d_m} \quad (4)$$

$$C_r = \frac{\varepsilon_r S}{d_r} \quad (5)$$

In the formulas (4) and (5), S is a device area, dm is a thickness of the retention layer 102, and dr is a thickness of the rectifier function layer 103. Here, when a voltage V is impressed to the variable resistive element 100, the voltage Vm divided to the retention layer 102 is represented by the following formula (6).

$$V_m = V \times \frac{\frac{1}{C_m}}{\frac{1}{C_m} + \frac{1}{C_r}} = V \times \frac{\frac{d_m}{\varepsilon_m}}{\frac{d_m}{\varepsilon_m} + \frac{d_r}{\varepsilon_r}} \quad (6)$$

Figure 12:
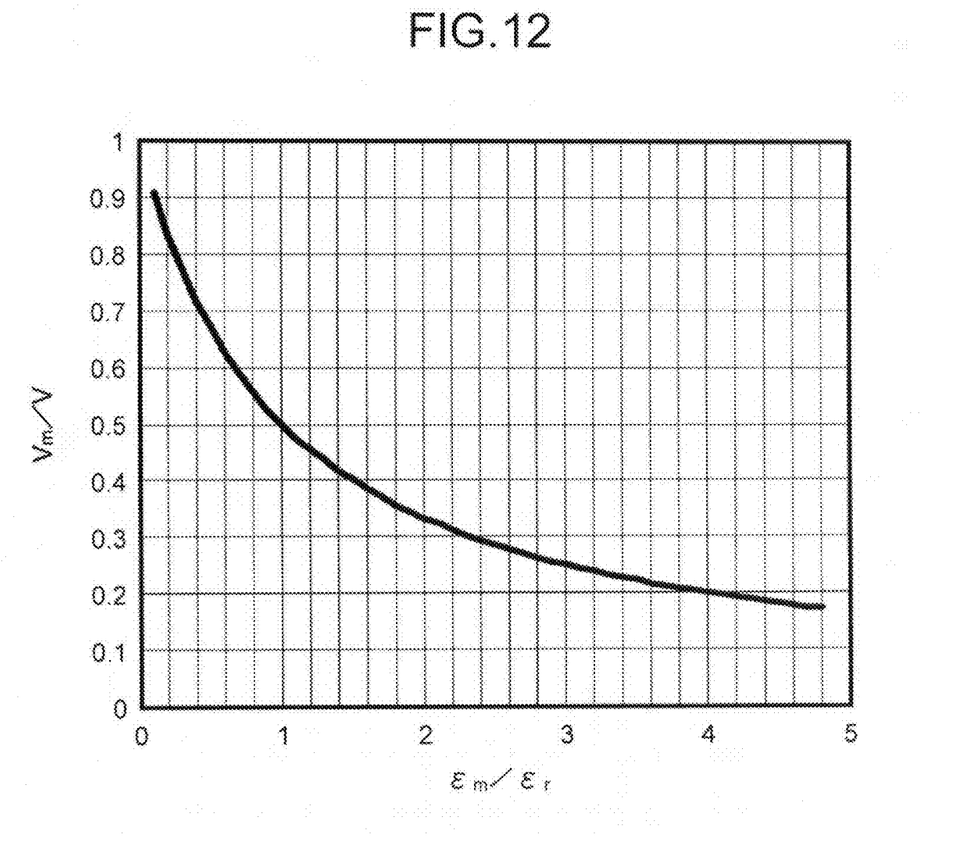
FIG. 12 is a graph showing a relationship between Vm/V and $\epsilon m/\epsilon r$ in a case of dm=dr according to the embodiment.

FIG. 12 is a graph showing a relationship between Vm/V and εm/εr in a case of dm=dr. As evidenced from FIG. 12, the smaller εm/εr is, the greater Vm/V becomes to approach 1. That is, the greater the relative permittivity εr of the rectifier function layer 103 is with respect to the relative permittivity εm of the retention layer 102, the greater the ratio of voltage divided for the retention layer 102 becomes, and thereby, it is possible to prevent possible increase of the set voltage Vset that can be caused by the existence of the rectifier function layer 103.

Now, the set voltage Vset in a case of the retention layer 102 being a silicon oxide will be described. As described above, for purpose of setting the variable resistive element 100, a set voltage (Vset_m) being necessary and sufficient for setting the retention layer 102 can be impressed to the retention layer 102. Therefore, the set voltage Vset to be impressed to the whole variable resistive element 100 can be rephrased as a total voltage V for dividing the set voltage Vset_m for the retention layer 102. For this reason, the set voltage Vset is a voltage satisfying Vm=Vset_m, and can be represented by the following formula (7).

$$V_{set} = V_{set\_m} \times \frac{\frac{d_m}{\varepsilon_m} + \frac{d_r}{\varepsilon_r}}{\frac{d_m}{\varepsilon_m}} \quad (7)$$

Figure 13:
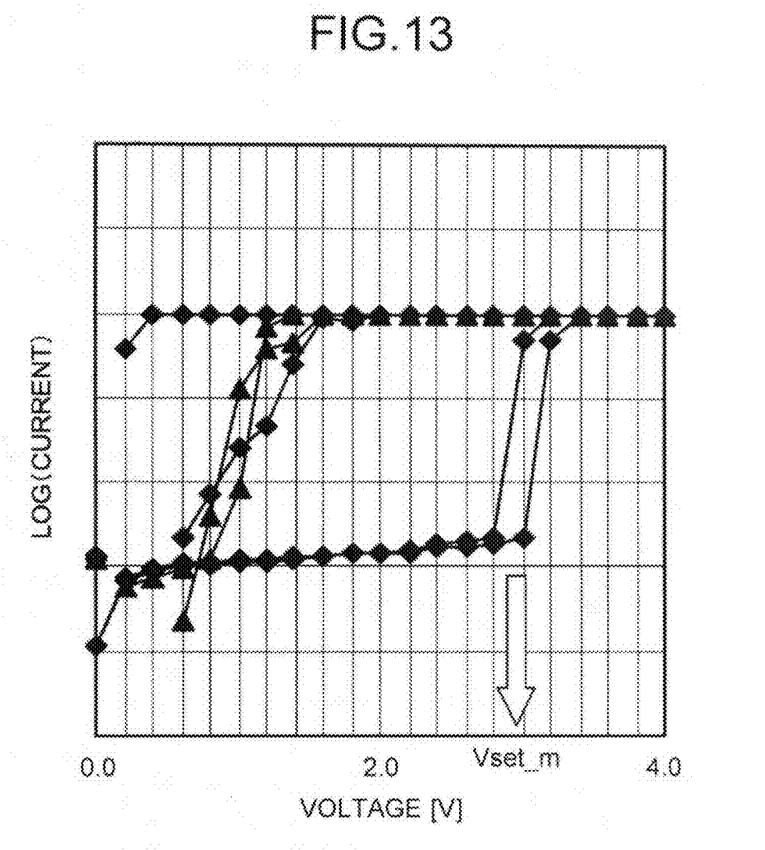
FIG. 13 is a graph showing an I-V characteristic of an element having a stack structure of Ag/silicon oxide/p+ silicon.

In FIG. 13, an example of an I-V characteristic of an element having a stack structure of Ag/silicon oxide/p+ silicon is shown. In the example shown in FIG. 13, a thickness of the silicon oxide is set to 2.0 nm. As shown in FIG. 13, when an impressed voltage is around 3.0 V, a current flowing through the element rises drastically. Therefore, the set voltage Vset of this element can be defined as about 3.0 V.

The set voltage Vset increases in proportion to a thickness of a base material of the insulator (in this description, a silicon oxide SiOx). Therefore, when the retention layer 102 is constructed from the silicon oxide, the set voltage Vset_m of the retention layer 102 is represented as 3.0*dm/2 [V]. Furthermore, due to the relative permittivity εm of the retention layer 102 being 3.9, the set voltage Vset for the whole variable resistive element 100 is represented by the following formula (8). In the following formula (8), a unit of d is nanometer.

$$V_{set} = 3.0 \times \frac{d_m}{2} \times \frac{\frac{d_m}{\varepsilon_m} + \frac{d_r}{\varepsilon_r}}{\frac{d_m}{\varepsilon_m}} \qquad (8)$$

$$= 3.0 \times \frac{d_m}{2} \times \frac{\frac{d_m}{3.9} + \frac{d_r}{\varepsilon_r}}{\frac{d_m}{3.9}}$$

$$= \frac{3}{2}\left(d_m + \frac{d_r}{\varepsilon_r} \times 3.9\right)(V)$$

Meanwhile, in a case of a large-capacity non-volatile memory in the Tbit (terabit) generation, it is expected that a pitch between adjacent lines becomes about 10 nm. In such case, in order to reduce a leakage between lines, it is preferable that the set voltage Vset is suppressed to be equal to or less than 8 V. A condition necessary for such arrangement can be derived from the following formula (9) based on the above-described formula (8).

$$d_m + \frac{d_r}{\varepsilon_r} \times 3.9 \le \frac{16}{3}(\text{nm}) \qquad (9)$$

That is, in order to suppress the set voltage to be equal to or less than 8V, in the case of the retention layer 102 being constructed from a silicon oxide, it is preferable that the above-described formula (9) is satisfied.

Moreover, when the rectifier function layer 103 is constructed from an amorphous silicon, the relative permittivity εr is 9.0. Therefore, on the basis of the above-describe formula (9), it is preferable that the thickness dm of the silicon oxide and the thickness dr of the amorphous silicon satisfy the following formula (10).

$$d_m + \frac{d_r}{9} \times 3.9 \le \frac{16}{3}(\text{nm}) \qquad (10)$$

Moreover, when the rectifier function layer 103 is constructed from a hafnium oxide, because the relative permittivity εr is 20, on the basis of the above-described formula (9), it is preferable that the thickness dm of the silicon oxide and the thickness dr of the hafnium oxide satisfy the following formula (11).

$$d_m + \frac{d_r}{20} \times 3.9 \le \frac{16}{3}(\text{nm}) \qquad (11)$$

In addition, a material of the rectifier function layer 103 is not limited to the amorphous silicon and the hafnium oxide as mentioned above, a titanium oxide, a tantalum oxide, an aluminum oxide, a lanthanoid oxide, an actinoid oxide, or the like can be used as the material of the rectifier function layer 103. Furthermore, a material of the second electrode 104 is not limited to a certain material while TiNx, TiSiyNx, doped Si, or the like, can be used as the material of the second electrode 104, for instance.

As described above, according to the embodiment, in the variable resistive element 100 having the structure in that the rectifier function layer 103 and the retention layer 102 are stacked, it is possible to obtain a device structure that enables reduction of the set voltage.

Figure 14:
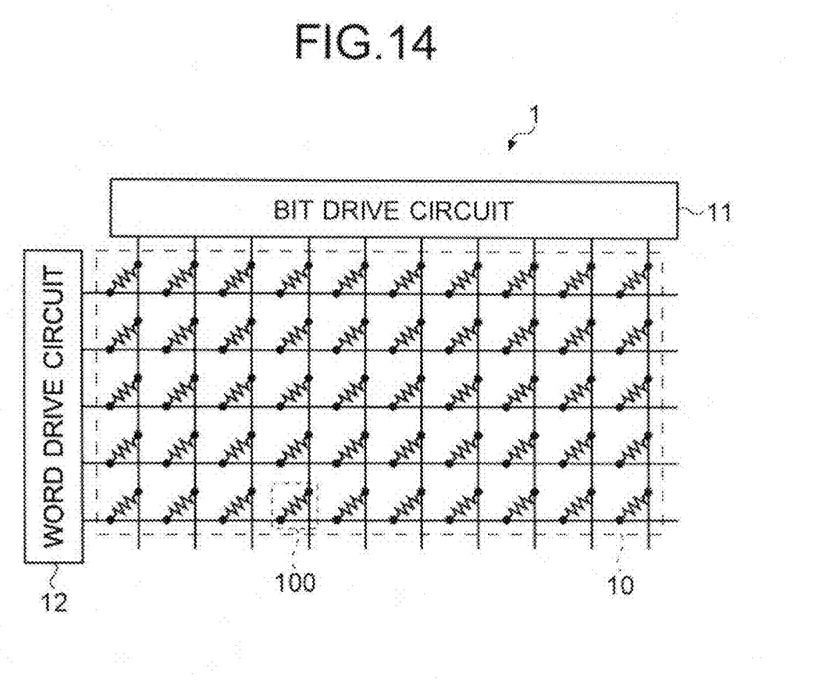
FIG. 14 is a schematic view showing an outline structure of a storage device having the variable resistive elements according to the embodiment.

In FIG. 14, an outline structure of a storage device having the variable resistive elements according to the embodiment is shown. As shown in FIG. 14, the storage device 1 has a memory cell array 10 in which the variable resistive elements 100 are arranged at cross-points of bit lines and word lines. To the bit lines, a bit drive circuit 11 for driving the bit lines is connected, and to the word lines, a word drive circuit 12 for driving the word lines is connected, both of them conducting there driving operation based on the control by the controller (not shown). Based on the operations explained with reference to FIGS. 7 to 9, the controller drives the bit drive circuit 11 and the word drive circuit 12 so that the readout voltage Vread or the reset voltage Vreset is impressed to the target variable resistive element 100. Thereby, it is possible to achieve a driving method of the storage device that enables reduction of the set voltage.

While a certain embodiment has been described, this embodiment has been presented by way of example only, and is not intended to limit the scope of the inventions. Indeed, the novel embodiment described herein may be embodied in a variety of other forms; furthermore, various omissions, substitutions and changes in the form of the embodiment described herein may be made without departing from the spirit of the inventions. The accompanying claims and their equivalents are intended to cover such forms or modifications as would fall within the scope and spirit of the inventions.

What is claimed is:

1. A variable resistive element which is able to transit between at least two states including a low-resistance state and a high-resistance state, the variable resistive element comprising:

a first electrode including metal elements;
a second electrode;
a first variable resistive layer located between the first electrode and the second electrode; and
a second variable resistive layer located between the first variable resistive layer and the second electrode, wherein
the first variable resistive layer is made by silicon oxide, and
when a thickness of the first variable resistive layer has a numerical value dm in units of nanometers [nm], a thickness of the second variable resistive layer has a numerical value dr in units of nanometers [nm], and a relative permittivity of the second variable resistive layer is defined as εr, the following formula (1) is satisfied $$d_m + \frac{d_r}{\varepsilon_r} \times 3.9 \le \frac{16}{3}(\text{nm}). \qquad (1)$$

2. The element according to claim 1, wherein the second variable resistive layer is made by silicon.

3. The element according to claim 2, wherein the dr and the dm satisfy the following formula (2)

$$d_m + \frac{d_r}{9} \times 3.9 \le \frac{16}{3}(\text{nm}). \qquad (2)$$

4. The element according to claim 1, wherein the second variable resistive layer is made by hafnium oxide.

5. The element according to claim 4, wherein the dr and the dm satisfy the following formula (3)

$$d_m + \frac{d_r}{20} \times 3.9 \leq \frac{16}{3} (nm). \qquad (3)$$

6. The element according to claim 1, wherein the first variable resistive layer contacts with the first electrode.

7. A storage device comprising:
two or more word lines;
two or more bit lines each of which crosses the word lines; and
the variable resistive elements of claim 1 each of which is located at each cross point of the word line and the bit line.

8. The storage device according to claim 7, wherein at least either one of a gap of the word lines and a gap of the bit lines is less than 10 nanometers.

* * * * *